（12) United States Patent
Shinma et al.

(10) Patent No.: US 7,696,616 B2
(45) Date of Patent: Apr. 13, 2010

(54) STACKED TYPE SEMICONDUCTOR DEVICE AND METHOD OF FABRICATING STACKED TYPE SEMICONDUCTOR DEVICE

(75) Inventors: Yasuhiro Shinma, Kanagawa (JP); Masanori Onodera, Tokyo (JP); Kouichi Meguro, Tokyo (JP); Koji Taya, Kanagawa (JP); Junji Tanaka, Tokyo (JP); Junichi Kasai, Kanagawa (JP)

(73) Assignee: Spansion LLC, Sunnyvale, CA (US)

( * ) Notice: Subject to any disclaimer, the term of this patent is extended or adjusted under 35 U.S.C. 154(b) by 149 days.

(21) Appl. No.: 11/339,352

(22) Filed: Jan. 25, 2006

(65) Prior Publication Data

US 2006/0170090 A1  Aug. 3, 2006

Related U.S. Application Data

(63) Continuation of application No. PCT/JP2005/001339, filed on Jan. 31, 2005.

(51) Int. Cl.
*H01L 23/02* (2006.01)

(52) U.S. Cl. ........................ 257/686; 257/685; 257/777; 257/E25.006; 257/E25.013; 257/E25.018; 257/E25.021; 257/E25.027; 257/E23.085; 257/E21.614; 438/109

(58) Field of Classification Search ................ 257/685, 257/777, E25.006, E25.013, E25.018, E25.021, 257/E25.027, E23.085, E21.614, 686; 438/109, 438/FOR. 368, FOR. 426
See application file for complete search history.

(56) References Cited

U.S. PATENT DOCUMENTS

| | | | | |
|---|---|---|---|---|
| 5,016,138 A | * | 5/1991 | Woodman | 361/688 |
| 5,343,075 A | * | 8/1994 | Nishino | 257/686 |
| 5,397,916 A | * | 3/1995 | Normington | 257/686 |
| 5,514,907 A | * | 5/1996 | Moshayedi | 257/723 |
| 5,726,492 A | * | 3/1998 | Suzuki et al. | 257/685 |
| 5,754,405 A | * | 5/1998 | Derouiche | 361/744 |
| 5,821,615 A | * | 10/1998 | Lee | 257/686 |
| 5,835,988 A | * | 11/1998 | Ishii | 257/684 |
| 5,857,858 A | * | 1/1999 | Gorowitz et al. | 439/86 |
| 5,883,431 A | * | 3/1999 | Dubelloy et al. | 257/718 |
| 6,049,123 A | * | 4/2000 | Burns | 257/686 |
| 6,121,676 A | | 9/2000 | Solberg | 257/686 |
| 6,445,063 B1 | * | 9/2002 | King et al. | 257/686 |
| 6,486,546 B2 | * | 11/2002 | Moden et al. | 257/686 |
| 6,686,655 B2 | * | 2/2004 | Moden et al. | 257/686 |
| 6,703,651 B2 | * | 3/2004 | Worz et al. | 257/209 |
| 6,801,440 B2 | * | 10/2004 | Inoue et al. | 361/803 |
| 2002/0006503 A1 | | 1/2002 | Watanabe et al. | 428/209 |
| 2002/0100965 A1 | * | 8/2002 | Matsuura et al. | 257/686 |
| 2007/0018303 A1 | * | 1/2007 | Lee | 257/686 |

FOREIGN PATENT DOCUMENTS

| | | |
|---|---|---|
| JP | 57-169298 | 10/1982 |
| JP | 6-77644 | 3/1994 |
| JP | 7-14979 | 1/1995 |
| JP | 2000294725 | 10/2000 |
| JP | 2001111192 | 4/2001 |
| JP | 2001-326441 | 11/2001 |
| JP | 2002076167 | 3/2002 |

* cited by examiner

Primary Examiner—Jasmine J Clark

(57) ABSTRACT

A stacked type semiconductor device includes semiconductor devices, interposers by which the semiconductor devices are stacked, the interposers having electrodes provided on sides thereof, and a connection substrate connecting the electrodes together. The electrodes provided on the sides of the interposers may be connected to the connection substrate by one of an electrically conductive adhesive or an anisotropically conductive film.

9 Claims, 10 Drawing Sheets

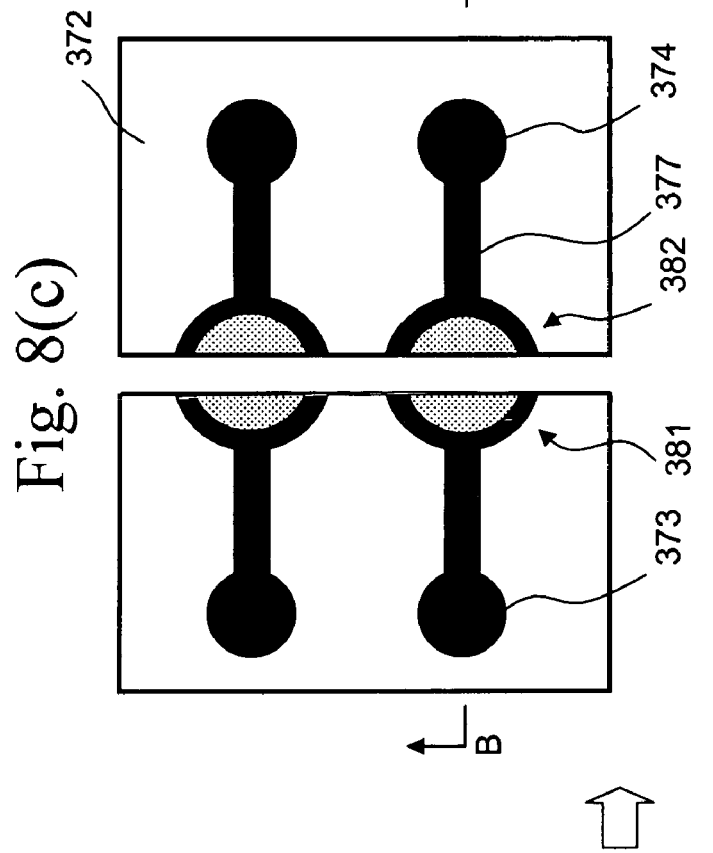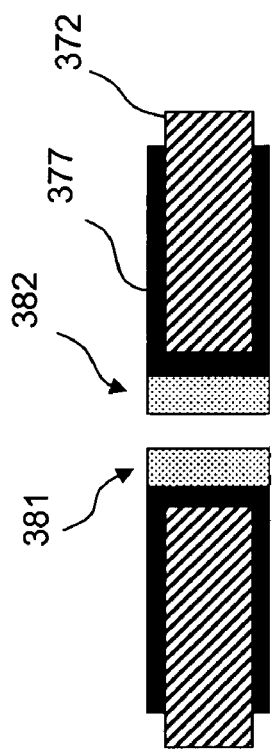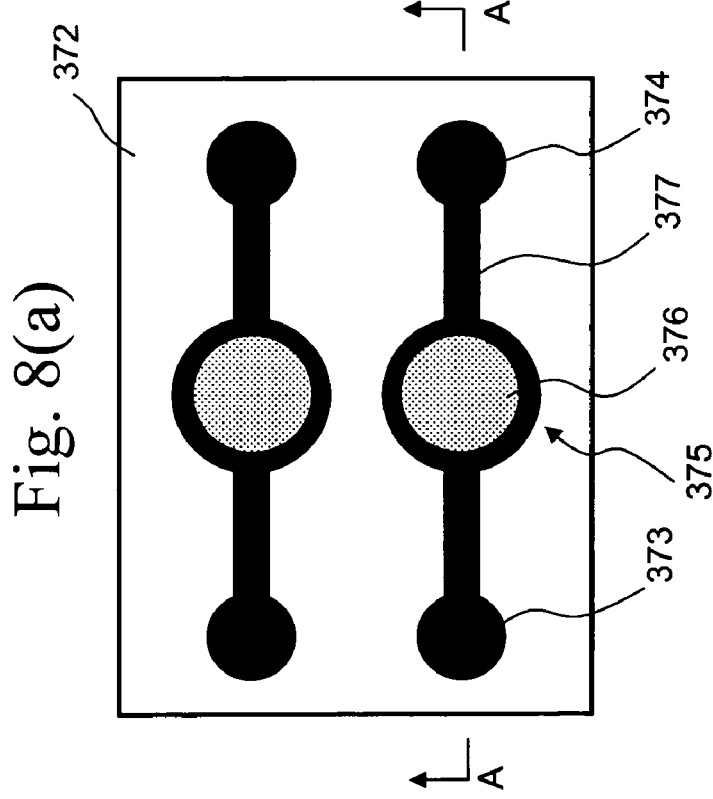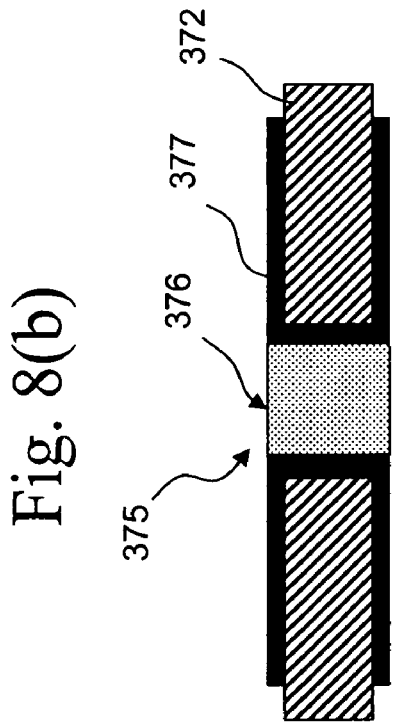

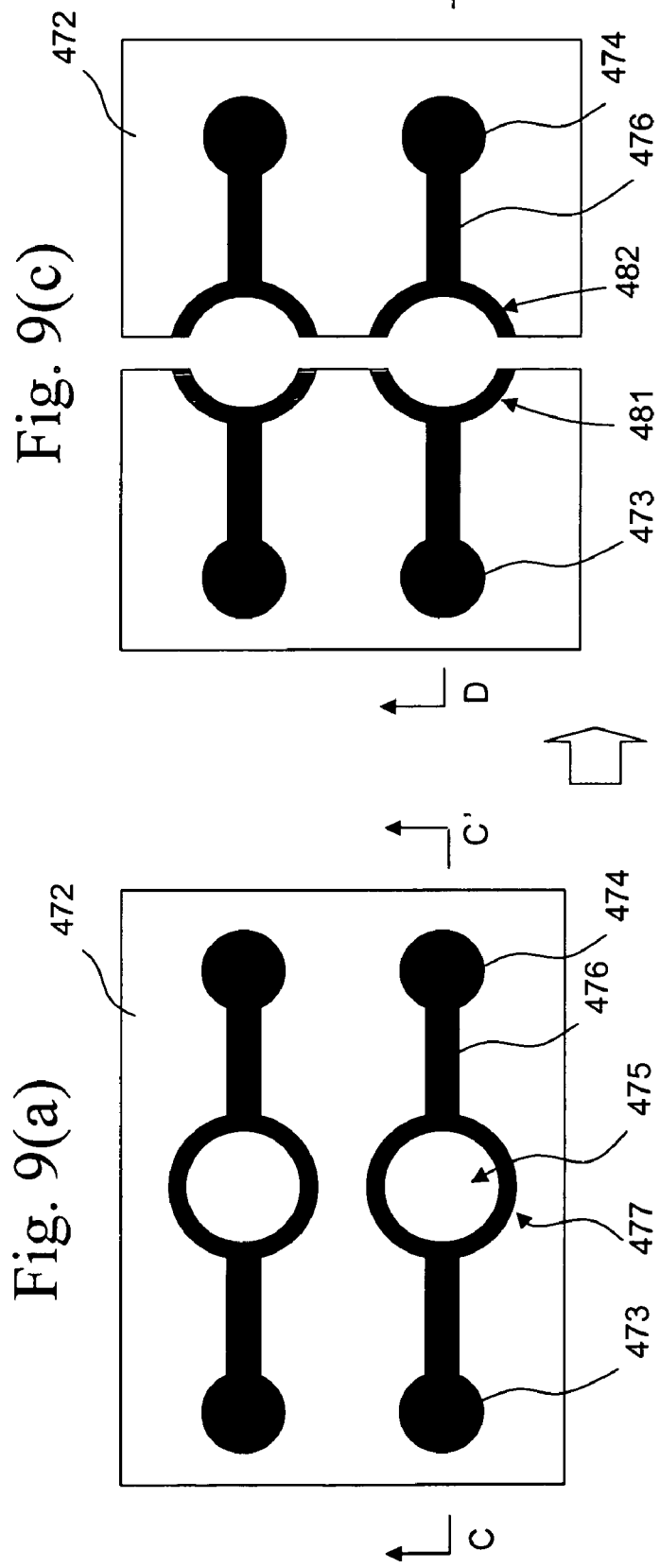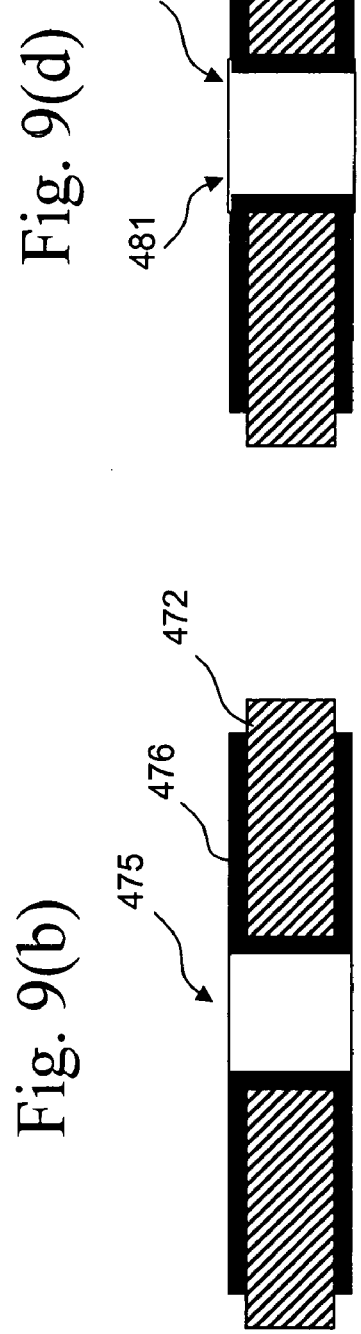

STACKED TYPE SEMICONDUCTOR DEVICE AND METHOD OF FABRICATING STACKED TYPE SEMICONDUCTOR DEVICE

CROSS REFERENCE TO RELATED APPLICATIONS

This is a continuation of International Application No. PCT/JP2005/001339, filed Jan. 31, 2005.

BACKGROUND OF THE INVENTION

1. Field of the Invention

The present invention relates to stacked-type semiconductor devices and a method of fabricating the same.

2. Description of the Related Art

Recently, portable electronic equipment such as mobile telephones and non-volatile semiconductor memory media such as IC memory cards have been downsized, and there have been increasing demands for reducing the number of parts used in the equipment and media and downsizing thereof. Thus, there have been considerable activities in the development of efficiently packaging a semiconductor chip, which is an essential element among structural components used in the equipment and memory media.

As packages that meet the demands, there are a chip scale package (CSP) having a package size substantially equal to that of the semiconductor chip, a multi-chip package (MCP) in which multiple semiconductor chips are incorporated into a single package, and a package-on-package (POP) in which multiple packages are stacked and combined into a single-piece member.

FIG. 1 shows a conventional carrier for stacked-type semiconductor devices (Related Art 1). Referring to FIG. 1, a stacked type semiconductor device 1 includes an upper package 2 and a lower package 3. The upper package 2 includes a semiconductor chip 21, a substrate 22, and wires 23 connecting the semiconductor chip 21 and the substrate 22. A resin seal member 24 is formed by molding with a metal. The upper package 2 and the lower package 3 are electrically connected by solder balls 4.

FIG. 2 shows another conventional stacked type semiconductor device (Related Art 2). Referring to FIG. 2, a stacked type semiconductor device 50 includes packages 51 through 53, which are connected to a flexible board 54 by solder balls. Other conventional stacked type semiconductor devices are proposed in the following documents.

U.S. Pat. No. 6,121,676 discloses a stacked type semiconductor device with a flexible board like Related Art 2. Japanese Patent Application Publication No. 2001-111192 discloses a stacked type semiconductor device with spacers provided on an interposer and electrodes provided on side surfaces of the spacers, wherein a connection substrate connects the electrodes. Japanese Patent Application Publication No. 2000-294725 discloses a stacked type semiconductor device with interposes each having opposing surfaces on which interconnection lines are formed, in which interconnection lines provided on boards mutually connect the interconnection lines on the interposers. Japanese Patent Application Publication No. 2002-76167 discloses a stacked type semiconductor device with a laminate including multiple semiconductor chips having electrodes on sides thereof, these electrodes being connected by electrode connecting lines.

Conventionally, the packages to be stacked have a specific structure that enables electrodes (lands) of the upper and lower packages to be placed in position in the stacked state. Usually, it takes one to two months to produce molds for the upper and lower packages. Generally, it is required to prepare several sample packages having different specifications of devices to be packaged. For example, these sample packages may have various sizes. As a result, it takes a long time to present required samples.

The conventional flexible board employed in the stacked type semiconductor device has a bent portion, which may protrude from the stacked structure. This prevents downsizing of package.

The technique disclosed in Japanese Patent Application Publication No. 2001-111192 needs a space on the peripheral portions of the interposer for arranging the spacers. This is disadvantageous to reduction in the package area. The technique described in Japanese Patent Application Publication No. 2000-294725 needs areas for arranging electrodes on opposing peripheral portions of printed-circuit boards, which electrodes are connected by interposers. The technique described in Japanese Patent Application Publication No. 2002-76167 is directed to only the predetermined semiconductor chips, and is not suitable for stacking various types of semiconductor chips.

The present invention has been made in view of the above problems and has an object of providing a downsized stacked type semiconductor device producible by a shortened process time and a method of fabricating such a stacked type semiconductor device.

This object of the present invention is achieved by a stacked type semiconductor device comprising: semiconductor devices; interposers by which the semiconductor devices are stacked, the interposers having electrodes provided on sides thereof; and a connection substrate connecting the electrodes together. The electrodes provided on the sides of the multiple interposers are connected by the connection substrate, so that the connections can be made on only the sides of the interposers. This does not need a bent portion of the connection substrate and is thus advantageous to downsizing of the stacked type semiconductor devices. It is also possible to handle various types of semiconductor chips and reduce the delivery period.

The electrodes provided on the sides of the interposers may have parts of via holes defined by cutting. The via holes for electrodes can be formed by the identical production process. Thus, there is no need for additional parts such as connectors conventionally used, and the semiconductor devices can be fabricated at a reduced cost. The electrodes provided on the sides of the interposers may have parts of via holes defines by cutting and an electrically conductive resin with which the via holes are filled.

The electrodes provided on the sides of the interposers may be connected to the connection substrate by one of an electrically conductive adhesive or an anisotropically conductive film. The electrically conductive adhesive can be precisely applied to target portions by a dispenser or the like, so that the interposers and the connection substrate can be stably connected. The anisotropically conductive film may be substituted for the electrically conductive adhesive. Some advantages arise from the anisotropically conductive film. For example, the anisotropically conductive film can make electrical connections with only the electrodes. The anisotropically conductive film has an even thickness, which causes little errors in size. The anisotropically conductive film may be connection substrate beforehand, which may reduce the number of fabrication steps. The connection substrate may be a flexible substrate. It is thus possible to cope with variations in the distance between the interposers and prevent degradation of the production yield.

The connection substrate may have one of a single-layer interconnection structure or a multi-layer interconnection structure. Preferably, each of the interposers has multiple sides on which the electrodes are connected to the connection substrate.

The present invention may have an electronic component provided on an inside surface of the connection substrate. The electronic component can be mounted without enlarging the outer size of the device. Each of the interposers may be attached to an underlying one of the semiconductor devices. This enables stable positioning and prevents the yield from being degraded. Each of the interposers may be attached to an underlying one of the semiconductor devices by an adhesive. The use of adhesive enables stable positioning and prevents the yield from being degraded. The adhesive may be a film of adhesive, which has an even thickness. The use of the film-like adhesives can realize the parallelized arrangement at a high precision and prevents degradation of the production yield due to connection failures.

The present invention includes a method of fabricating a stacked type semiconductor device including: stacking semiconductor devices with interposers having electrodes provided on sides of the interposers; and connecting the electrodes together with a connection substrate. The connections are made on only the sides of the interposers, and have no need to have bent portions. This is advantageous to downsizing. It is also possible to handle various types of semiconductor chips and reduce the delivery period.

The method may further include forming the electrodes by cutting into the interposers along via holes provided therein. The via holes for electrodes can be formed by the identical production process. Thus, there is no need for additional parts such as connectors conventionally used, and the semiconductor devices can be fabricated at a reduced cost. The electrodes provided on the sides of the interposers may have parts of via holes defines by cutting and an electrically conductive resin with which the via holes are filled. The method may include forming the electrodes by cutting into the interposers along via holes provided therein, and filling the via holes with an electrically conductive adhesive.

The method may include: forming the electrodes by cutting into the interposers along via holes provided therein; providing a metal film on inner walls of the via holes; and supplying one of an electrically conductive adhesive or an anisotropically conductive film to the via holes. It is thus possible to connect the connection substrate to the interposers even if there is a difficulty in filling the via holes with the conductive adhesive.

BRIEF DESCRIPTION OF THE DRAWINGS

Other objects, features and advantages of the present invention will become more apparent from the following detailed description when read in conjunction with the accompanying drawings, in which:

FIGS. 8(a) through 8(d) show a step of cutting via holes in a first method of fabricating a stacked type semiconductor device;

FIGS. 9(a) through 9(d) show a step of cutting via holes in a second method of fabricating a stacked type semiconductor device.

DESCRIPTION OF THE PREFERRED EMBODIMENTS

Figure 1:
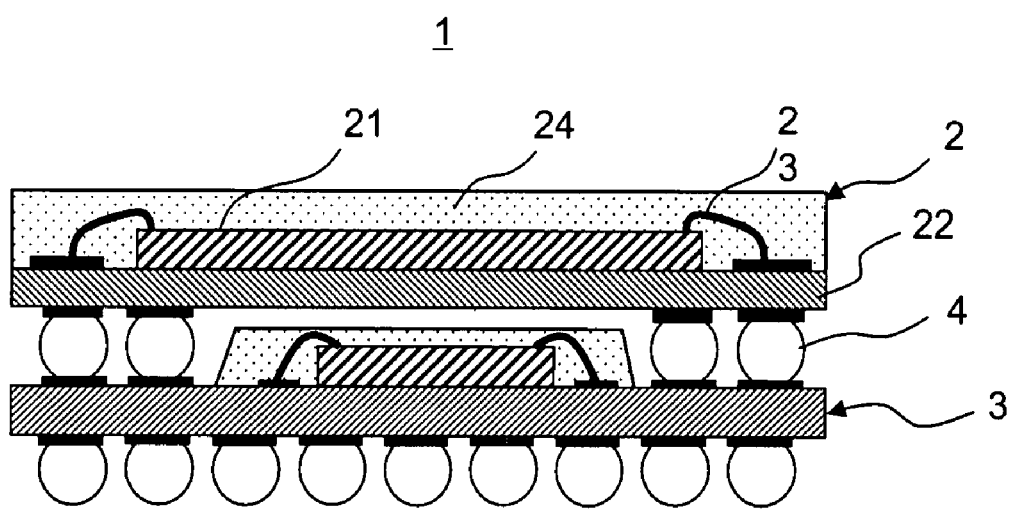
FIG. 1 shows a conventional stacked type semiconductor device.
Figure 2:
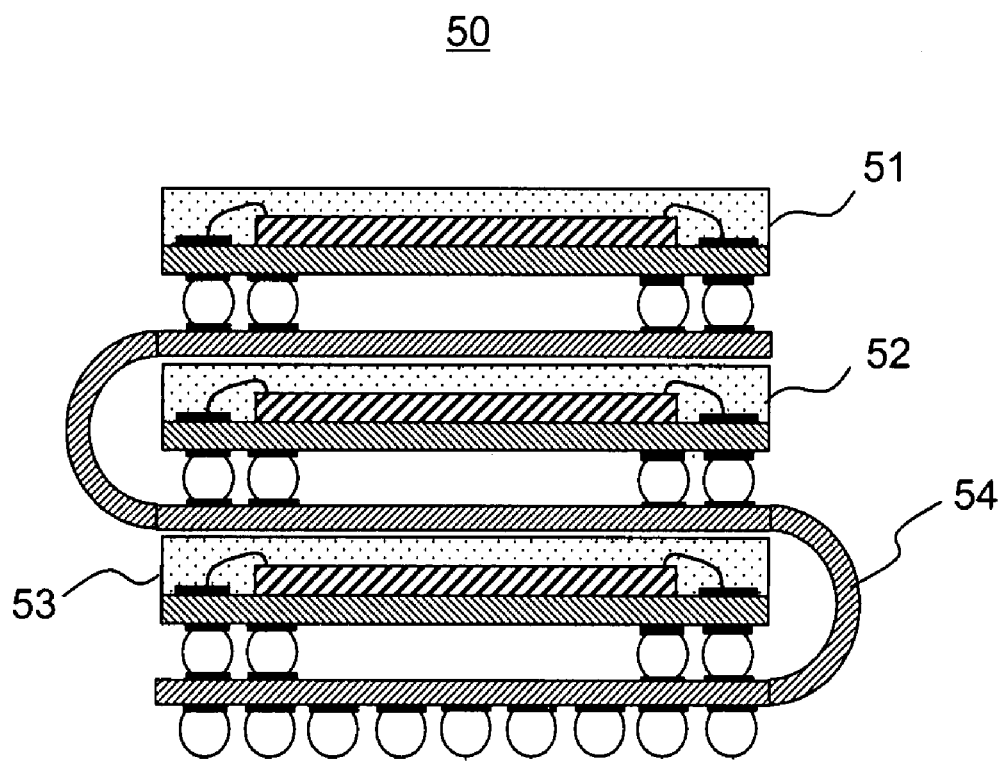
FIG. 2 shows another conventional stacked type semiconductor device.
Figure 3:
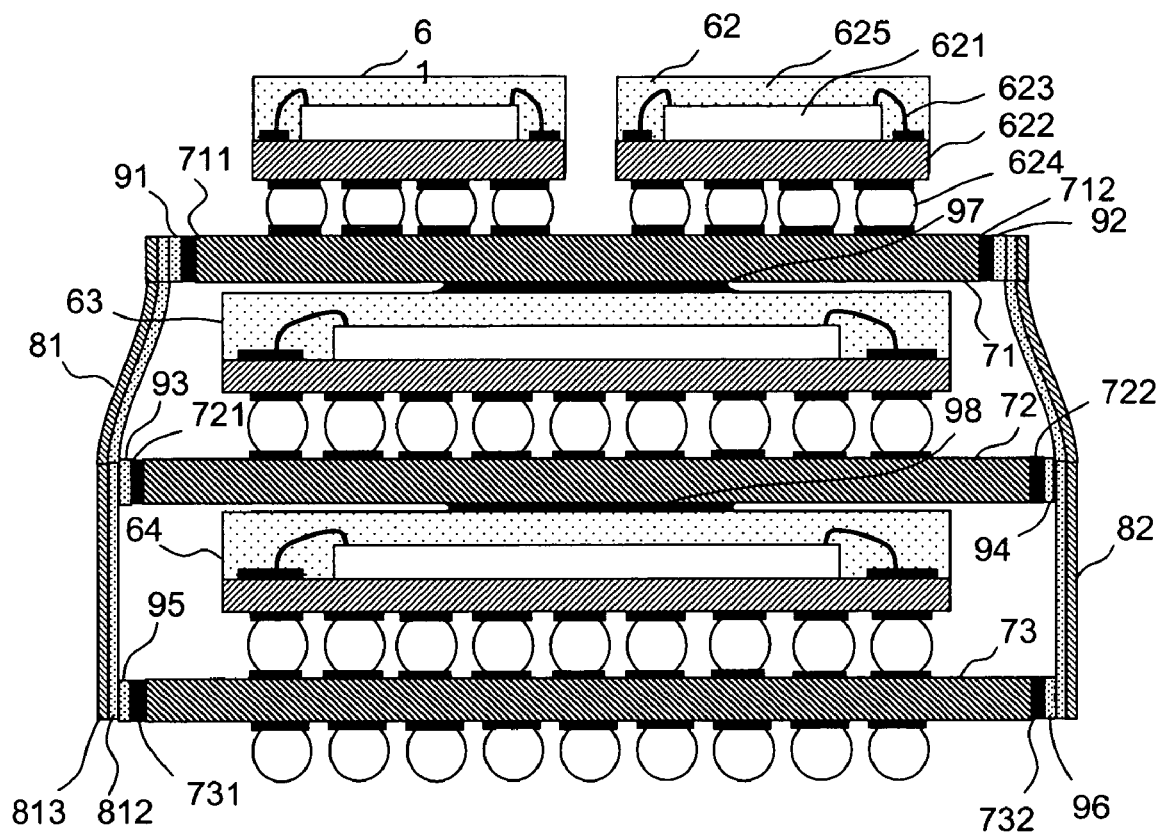
FIG. 3 shows a stacked type semiconductor device according to an embodiment of the present invention.

A description will now be given, with reference to the accompanying drawings, of embodiments of the present invention. FIG. 3 shows a stacked type semiconductor device according to an embodiment of the present invention. A stacked type semiconductor device 60 includes multiple stacked semiconductor devices 61 through 64, multiple interposers 71 through 73, and connection substrates 81 and 82. The interposers 71 through 73 have electrodes 711 through 732 on and in contact with sides thereof. The connection substrates 81 and 82 connect the electrodes 711 through 732. For example, the semiconductor device 62 includes a semiconductor chip 621, a substrate 622, wires 623 connecting the semiconductor chip 621 and the substrate 622, and resin seal member 625. The semiconductor device 62 is electrically to the terminals of the interposer 71 via solder balls 624.

Figure 4:
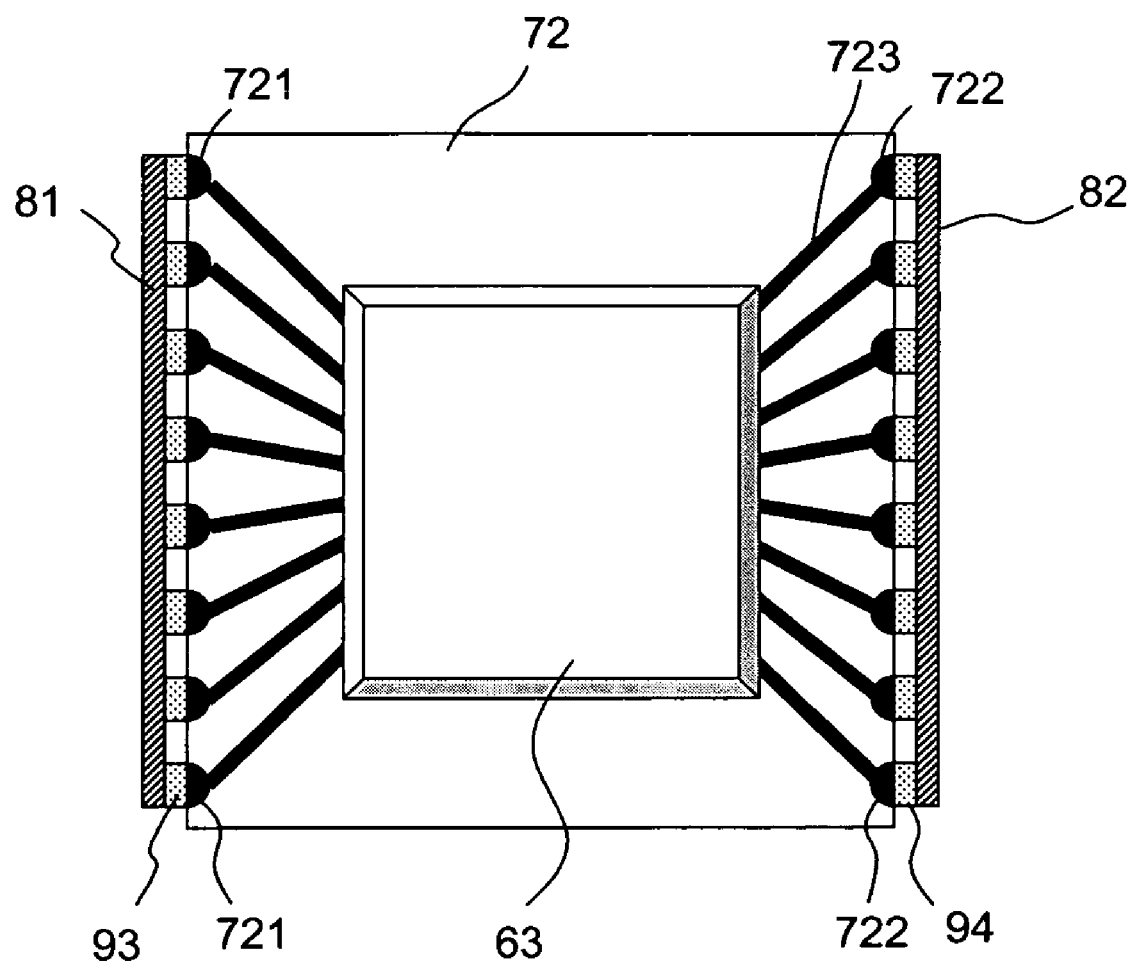
FIG. 4 shows connections between electrodes provided on end surfaces of an interposer and connection substrates.

FIG. 4 shows connections between the electrodes provided on the ends of an interposer and the connection substrates. A plurality of electrodes 721 and 722 are provided on two opposing sides of the interposer 72. The electrodes 721 and 722 are connected to terminals provided below the semiconductor device 63 by interconnection patterns 723. The electrodes 721 and 722 provided on the ends of the interposer 72 are connected to the connection substrates 81 and 82 through electrically conductive adhesive layers 93 and 94. The electrically conductive adhesive can be precisely applied to target portions by a dispenser or the like, so that the interposers and the connection substrates can be stably connected. An anisotropically conductive film may be substituted for the electrically conductive adhesive. Some advantages arise from the anisotropically conductive film. For example, the anisotropically conductive film can make electrical connections with only the electrodes. The anisotropically conductive film has an even thickness, which causes little errors in size. The anisotropically conductive film may be connection substrate beforehand, which may reduce the number of fabrication steps.

Figure 5:
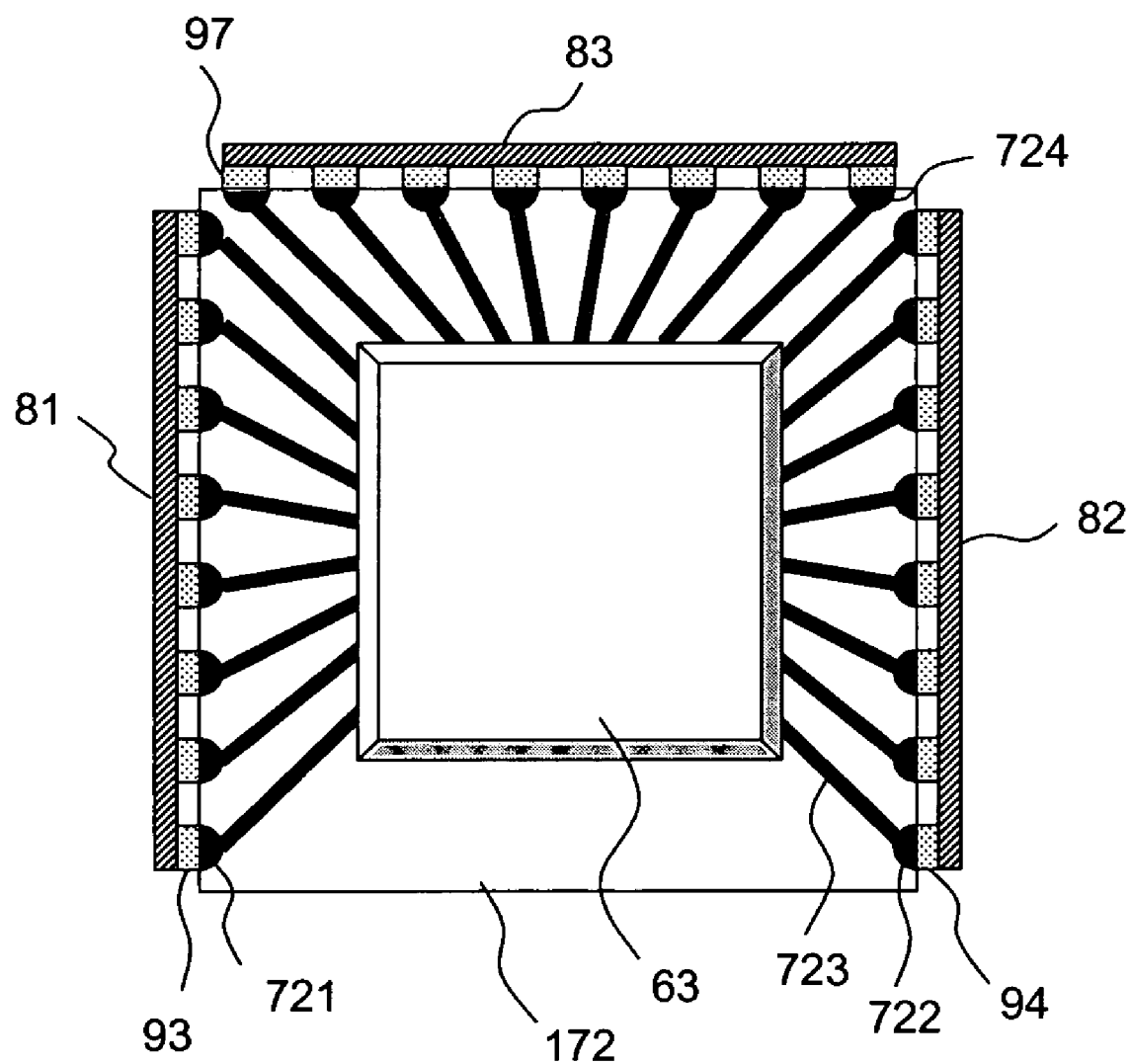
FIG. 5 shows other exemplary connections between electrodes provided on end surfaces of an interposer and connection substrates.

FIG. 5 shows other exemplary connections between electrodes provided on end surfaces of an interposer and connection substrates. In the structure shown in FIG. 5, three sides (ends) of the interposer are used to make connections between the electrodes provided thereon and the connection substrates. A large number of electrodes 721, 722 and 724 is provided on the three sides of the interposer 172. The electrodes 721, 722 and 724 are connected to terminals provided below the semiconductor device 63 via interconnection patterns 723. The electrodes 721, 722 and 724 are connected to the connection substrates 81, 82 and 83 via electrically conductive adhesives 93, 94 and 97, respectively.

The connections between the electrodes on the ends of the interposer and the connection substrates do not need the use of three sides of the interposer, but may be made using at least one side of the interposer. The electrodes may be provided to all of the four sides of the interposer at maximum. If there is a difficulty in arranging interconnection patterns or terminals on a certain substrate area or side, only some sides of the interposer may be used for making connections with the connection substrates, as shown in FIG. 5. When the connection substrates are provided to all the four sides of the interposer, a closed space is formed in the stacked type semiconductor device, which may be broken due to thermal expansion resulting from heat applied in reflow. If there is such a possibility, the three sides of the interposer will be used for making connections with the connection substrates at maximum.

Turning to FIG. 3 again, the connection substrates 81 and 82 may be formed by flexible circuit boards, which may have a single or multiple interconnection layers. In the exemplary structure shown in FIG. 3, each of the connection substrates 81 and 82 have a single-layered interconnection layer 812 and a single-layered interconnection layer 813. The semiconductor devices 61 through 64 are electrically connected to the solder balls provided on the interposer 73 via the interconnection layers 812. If there are many interconnection lines, multi-layered interconnection layers may be substituted for the single-layered interconnection layers 812. The flexible connection substrates 81 and 82 are capable of making connections even when the interposers are deformed, and have flexibility to variations in the dimensions of the interposers. It is thus possible to prevent the production yield from being lowered due to a connection failure. Actually, the distance between the interposers and the precision of parallelized arrangement thereof are not constant over devices. If a rigid board is used to make connections between stacked interposers, a connection failure may occur under a situation in which the interposers are arranged at a distance longer than a given distance or with a precision of parallelized arrangement less than a given level.

The interposers 71 and 72 are fixed to semiconductor devices 63 and 64 of lower stages by adhesive layers 97 and 98, respectively. In case where the interposers 71 and 72 are not fixed to the semiconductor devices 63 and 64, the connection substrates 81 and 82 will be fixed to the interposes 71 and 72 with a poor precision in positioning. This may degrade the production yield. This problem becomes more conspicuous as the areas of the interposers become larger. The use of the adhesive layers 97 and 98, which fix the interposers 71 and 72 to the underlying semiconductor devices 63 and 64, enables precise positioning of the connection substrates 81 and 82 and prevents degradation of the production yield.

Preferably, the adhesive layers 97 and 98 are film-like adhesives, which have an even thickness. The use of the film-like adhesives can realize the parallelized arrangement at a high precision and prevents degradation of the production yield due to connection failures. The adhesive films may be of a type in which adhesiveness is generated by heating it or may be of a three-layer type in which adhesive layers are provided on opposing surfaces of a core film.

Figure 6:
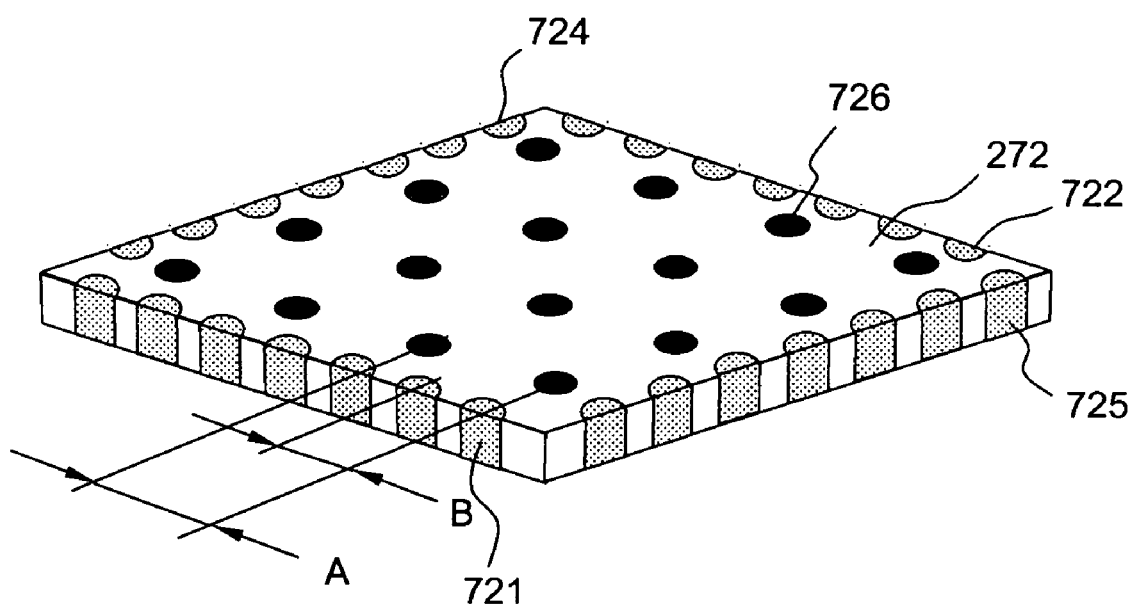
FIG. 6 shows another exemplary interposer.

FIG. 6 shows another exemplary structure of the interposer. Referring to FIG. 6, electrodes 721, 722, 724 and 725 are provided to the four sides of the interposer 272. Solder balls of the semiconductor device are connected to the terminals 726, which are connected to the electrodes 721, 722, 724 and 725 via interconnection lines provided within the interposer 272. The electrodes 721, 722, 724 and 725 are arranged at pitches (B) less than that (A) of the terminals 726 provided on the surface of the interposer 272. This setting of the pitches enlarges the degree of flexibility in the layout of interconnection lines connected to the terminals provided on the sides of the interposer.

Figure 7:
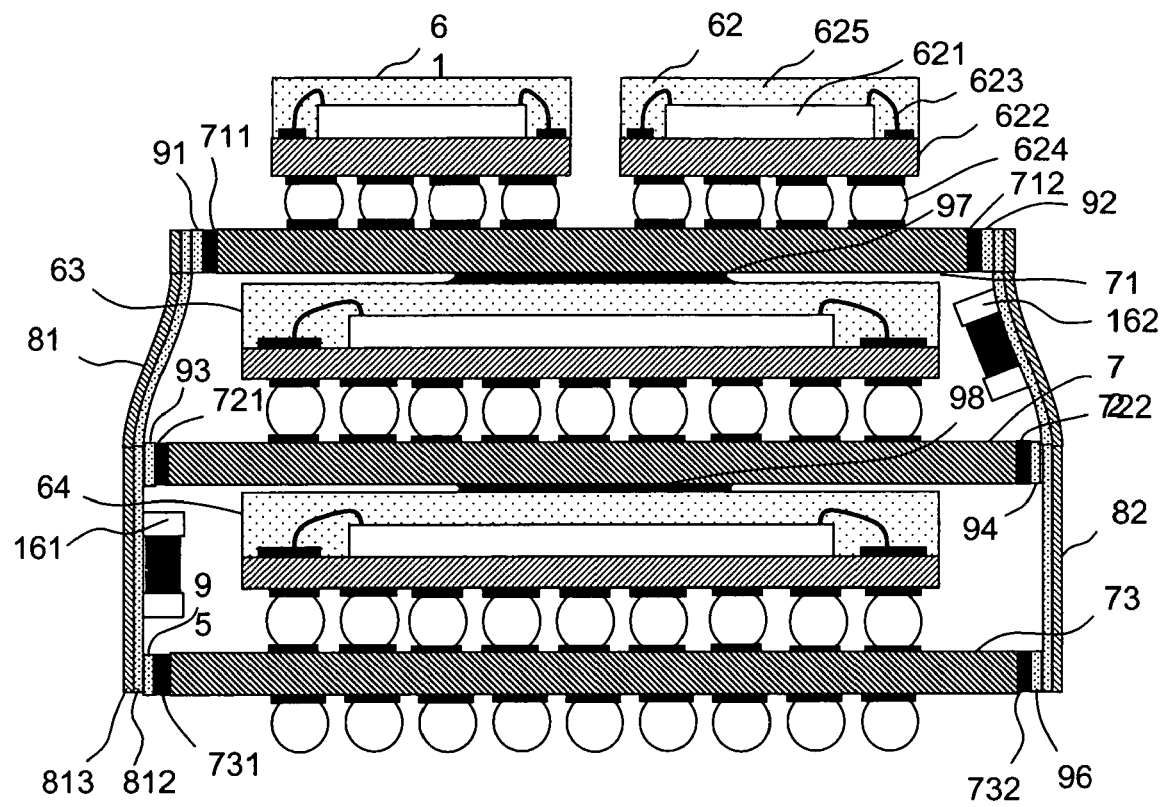
FIG. 7 shows a stacked type semiconductor device on which electronic parts are mounted on a connection substrate.

FIG. 7 shows a stacked type semiconductor device 160 in which electronic parts are mounted to the connection substrates. Chip parts (electronic parts) 161 and 162 are provided on inner surfaces of the connection substrates 81 and 82, respectively. With this arrangement, the electronic parts can be mounted without enlarging the outer size of the stacked type semiconductor device. The electronic parts may be, for example, chip capacitors or chip resistors. Many chip components may have heights less than those of the LSI packages and semiconductor chips and may be interposed between the stacked interposers.

FIGS. 8(a) through 8(d) show a process of producing the interposer in a first method of fabricating the stacked type semiconductor device, wherein FIG. 8(a) shows a part of interposers before cutting, FIG. 8(b) is a cross-sectional view taken along a line A-A' shown in FIG. 8(a), FIG. 8(c) shows two interposers after cutting, and FIG. 8(d) is a cross-sectional view taken along a line B-B' shown in FIG. 8(c). In the structure shown in FIGS. 8(a) through 8(d), via holes full of conductive resin are used as means (for example, electrodes 721 shown in FIG. 6) for connecting the interposer and the connection substrate(s). As shown in FIG. 8(a), a substrate 372 is provided with terminals 373 and 374, via holes 375, and interconnection patterns 377 for connecting the terminals 373 and 374 and the via holes 375. The vial holes 375 are filled with conductive adhesive 376. A process of cutting the substrate 372 along an alignment of via holes 375 results in tow interposers 381 and 382 as shown in FIG. 8(c). The terminals provided on the sides of the interposers are defined by cutting the via holes full of conductive resin.

The cutting surfaces of the via holes full of conductive resin are exposed to the side ends of each interposer and function as electrodes to which the connection substrates can be connected. The via holes arranged in a line are formed by via holes arranged in other lines, so that all the via holes of each interposer can be formed by the same production process. This does not need any additional parts such as connectors that are mechanically attached to the interposers and reduces the production cost. Preferably, the via holes have a sufficient size to make connections with the connection substrates and are formed in the substrate by drilling rather than the photolithography technique in order to improve productivity.

Figure 10E:
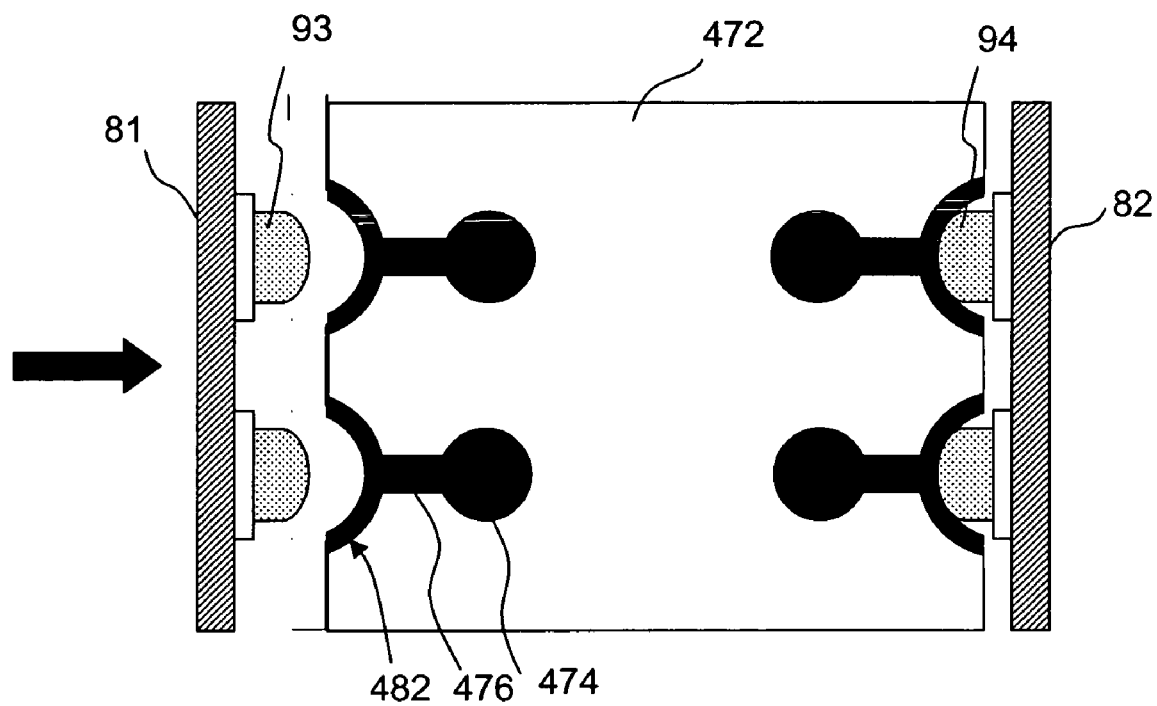
FIGS. 10(e) and 10(f) show a step of electrically connecting an interposer and connection substrates in the second method of fabricating a stacked type semiconductor device.
Figure 10F:
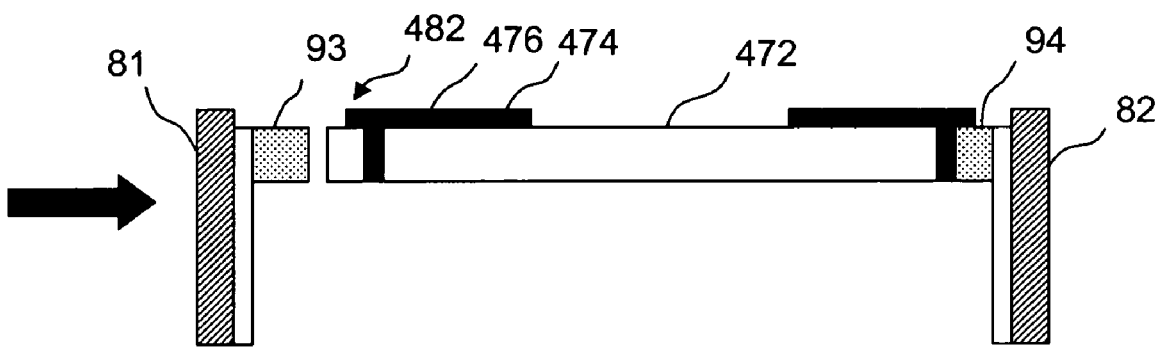

FIGS. 9(a) through 9(d) show a process of producing the interposer in a second method of fabricating the stacked type semiconductor device, wherein FIG. 9(a) shows a part of interposers before cutting, FIG. 9(b) is a cross-sectional view taken along a line C-C' shown in FIG. 9(a), FIG. 9(c) shows two interposers after cutting, and FIG. 9(d) is a cross-sectional view taken along a line D-D' shown in FIG. 9(c). FIG. 10(e) is a plan view of a step of electrically connecting the interposer and connection substrates by a conductive adhesive in the second method of fabricating a stacked type semiconductor device, and FIG. 10(f) is a front view thereof. As shown in FIG. 9(a), a substrate 472 is provided with terminals 473 and 474, a via hole 475, and interconnection lines 476 for connecting the terminals 473 and 474 and the via hole 475.

The inner wall of each via hole 475 is coated with a metal film 477. A process of cutting the substrate 472 along the alignment of the via holes 475 results in electrodes 481 and 482 formed on the sides of the interposers, as shown in FIG. 9(c). As shown in FIGS. 10(e) and 10(f), the conductive adhesives 93 or anisotropically conductive films are supplied to the electrodes 482, and the electrodes on the sides of the interposer 472 are electrically connected together via the connection substrates 81 and 82. As described above, the process of cutting the substrate along the alignment of the via holes having the inner walls to which the metal film is provided results in the cut surfaces that are exposed to the sides of the interposers and serve as the electrodes for making connections with the connection substrates. The via holes arranged in a line are formed by via holes arranged in other lines, so that all the via holes of each interposer can be formed by the same production process. This does not need any additional parts such as connectors that are mechanically attached to the interposers and reduces the production cost. Preferably, the via holes have a sufficient size to make connections with the connection substrates and are formed in the substrate by drilling rather than the photolithography technique in order to improve productivity. Even if there is a difficulty in filling the via holes with the conductive adhesive, the connection substrates may be connected to the interposer by applying conductive adhesive or anisotropically conductive films to the electrodes of the connection substrates or the electrodes of the interposer.

The stacked type semiconductor devices may be fabricated by a process including the steps of stacking semiconductor devices with interposers having electrodes provided on sides of the interposers; forming the electrodes by cutting into the interposers along via holes provided therein; and connecting the electrodes together with a connection substrate. The step of forming the electrodes may be replaced by a step of forming the electrodes by cutting into the interposers along via holes provided therein, and filling the via holes with an electrically conductive adhesive. The step of forming the electrodes may also be replaced by a step of: forming the electrodes by cutting into the interposers along via holes provided therein; providing a metal film on inner walls of the via holes; and supplying one of an electrically conductive adhesive or an anisotropically conductive film to the via holes.

As has been described, the electrodes 711 through 732 provided on the sides of the multiple interposers 71 through 73 are connected by the connection substrates 81 and 82, so that the connections can be made on only the sides of the interposers. This does not need a bent portion of the connection substrates 81 and 82 and is advantageous to downsizing of the stacked type semiconductor devices.

The preferred embodiments of the present invention have been described. The present invention is not limited to the specifically described embodiments, but various variations and modifications may be made within the scope of the claimed invention.

What is claimed is:

1. A stacked type semiconductor device structure comprising:
   semiconductor devices;
   interposers that are used to stack the semiconductor devices, wherein the interposers comprise electrodes that are provided on and in contact with sides thereof; and
   a connection substrate electrically connecting the electrodes together wherein the electrodes are provided in parts of via holes.

2. The stacked type semiconductor device structure as claimed in claim 1, wherein the electrodes provided on the sides of the interposers are provided in parts of via holes defined by cutting and an electrically conductive resin with which the via holes are filled.

3. The stacked type semiconductor device structure as claimed in claim 1, wherein the electrodes provided on the sides of the interposers are connected to the connection substrate by one of an electrically conductive adhesive or an anisotropically conductive film.

4. The stacked type semiconductor device structure as claimed in claim 1, wherein the connection substrate has one of a single-layer interconnection structure or a multi-layer interconnection structure.

5. The stacked type semiconductor device structure as claimed in claim 1, wherein each of the interposers has multiple sides on which the electrodes are connected to the connection substrate.

6. The stacked type semiconductor device structure as claimed in claim 1, further comprising an electronic component provided on an inside surface of the connection substrate.

7. A method of fabricating a stacked type semiconductor device comprising:
   stacking semiconductor devices using interposers and providing electrodes on and in contact with the sides of the interposers wherein the electrodes are formed by cutting into the interposers along via holes provided therein; and
   electrically connecting the electrodes together with a connection substrate.

8. The method as claimed in claim 7, comprising forming the electrodes by cutting into the interposers along via holes provided therein, and filling the via holes with an electrically conductive adhesive.

9. The method as claimed in claim 7, comprising:
   forming the electrodes by cutting into the interposers along via holes provided therein;
   providing a metal film on inner walls of the via holes; and
   supplying one of an electrically conductive adhesive or an anisotropically conductive film to the via holes.

* * * * *